United States Patent
Lee

(10) Patent No.: US 8,021,984 B2
(45) Date of Patent: Sep. 20, 2011

(54) METHOD FOR MANUFACTURING SEMICONDUCTOR

(75) Inventor: Wan-Gi Lee, Nowon-gu (KR)

(73) Assignee: Dongbu HiTek Co., Ltd., Seoul (KR)

( * ) Notice: Subject to any disclaimer, the term of this patent is extended or adjusted under 35 U.S.C. 154(b) by 86 days.

(21) Appl. No.: 12/644,346

(22) Filed: Dec. 22, 2009

(65) Prior Publication Data
US 2010/0167550 A1 Jul. 1, 2010

(30) Foreign Application Priority Data
Dec. 30, 2008 (KR) .................. 10-2008-0137465

(51) Int. Cl.
*H01L 21/311* (2006.01)
(52) U.S. Cl. ............ 438/700; 438/5; 257/328; 257/340; 257/409; 257/508; 257/E21.249
(58) Field of Classification Search .................. None
See application file for complete search history.

(56) References Cited

U.S. PATENT DOCUMENTS
2004/0031987 A1* 2/2004 Henninger et al. ........... 257/328

* cited by examiner

*Primary Examiner* — Charles D Garber
*Assistant Examiner* — Yasser A Abdelaziez
(74) *Attorney, Agent, or Firm* — Sherr & Vaughn, PLLC

(57) ABSTRACT

A method for manufacturing a semiconductor includes forming an active region for an ESD device, an active region for a first polygate and the semiconductor, and a second polygate having a form of a blanket trench on a substrate, forming an interlayer dielectric layer including first and second insulating on the substrate, planarizing the interlayer dielectric layer, forming a contact pattern to open a portion of the interlayer dielectric layer over the first polygate, forming a first polygate trench by performing a first etch process with respect to the second insulating layer below the contact pattern, and performing a second etch process to remove the first insulating layer inside the first polygate trench and to remove the first insulating layer over the active region of the semiconductor other than the second polygate.

20 Claims, 2 Drawing Sheets

US 8,021,984 B2

METHOD FOR MANUFACTURING SEMICONDUCTOR

Figure 1:
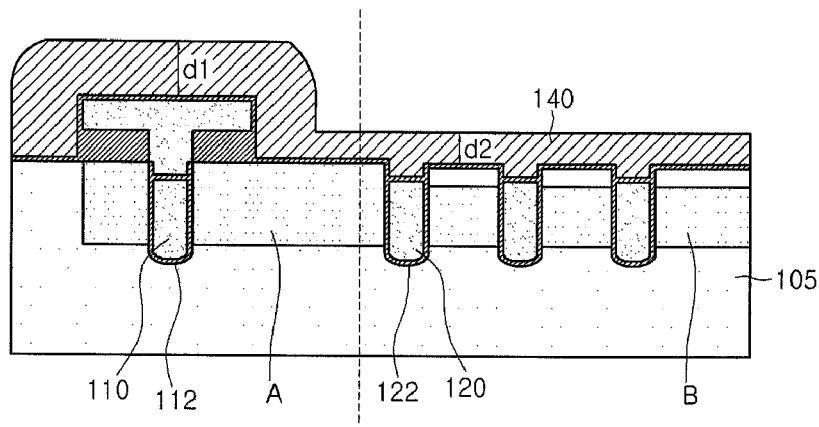
Figure 2:
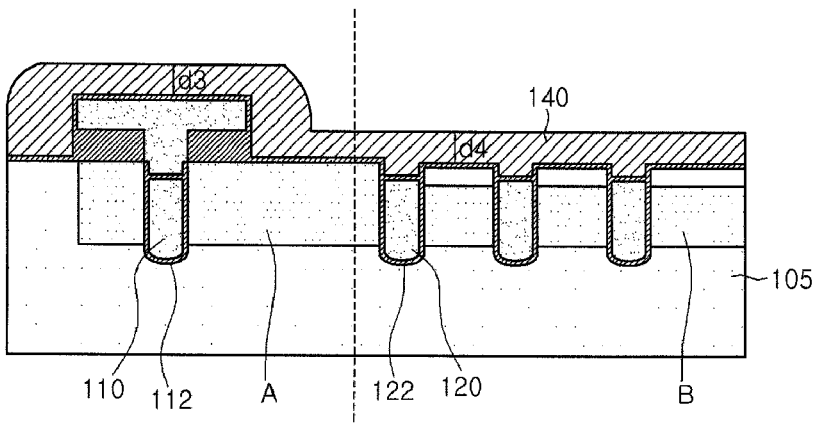

This application claims under 35 U.S.C. §119 to Korean Patent Application No. 10-2008-0137465 (filed Dec. 30, 2008), which is hereby incorporated by reference in its entirety.

BACKGROUND

When an electro-static discharge (ESD) device is realized in a single substrate together with a semiconductor such as a metal-oxide semiconductor field-effect transistor (MOSFET), a normal contact is formed in the ESD device region, and a blanket contact is formed in the semiconductor region.

When forming the normal contact and the blanket contact by using a single mask, tetraethyl orthosilicate; $Si(C_2H_5O_4)$ and borophosphosilicate glass (BPSG) are sequentially deposited on the ESD device region and the semiconductor region to form a polysilicon-metal dielectric (PMD) layer. Thereafter, a pattern is formed in order to form the normal contact over an ESD poly. In this case, the region for the blanket contact does not require a pattern.

In the case of the normal contact, a trench having the shape of a wine glass is formed in order to perform a metal gap fill process. In this case, after performing an isotrophic etch process, an anisotrophic process is performed to form a trench having a desired profile. However, after the etch processes have been performed, a PMD layer may be excessively removed from the blanket contact although the PMD layer having a predetermined thickness is formed on the blanket contact. Accordingly, an insulating function is not achieved on the blanket contact. This phenomenon may occur by the following causes.

First, since the PMD layer is thicker in the ESD device region than in the semiconductor region due to difference between the contact structures, most of the PMD layer is removed from the semiconductor region in the etch processes. In other words, although the BPSG must be etched by about 1000 Å or less on a trench poly of the semiconductor region, the BPSG is etched from the trench poly by about 2000 Å or more due to thickness difference. Accordingly, the contact of the ESD device cannot be formed if the loss of the BPSG of the semiconductor region is maintained to about 1000 Å or less.

Second, in order to improve the contact property of the normal contact over the poly of the ESD device, an etch process must be sufficiently performed by using a mask. In contrast, in the case of the blanket contact of the semiconductor region, an etch process must be performed at an etch rate as low as possible such that the PMD layer over the trench poly is removed as little as possible. This causes a contradiction situation in the contact etch process.

SUMMARY

Embodiments provide contacts of an ESD device and a semiconductor, capable of maximizing conductivity by etching an insulating layer on a normal contact of the ESD device as thick as possible, and maximizing insulating properties by etching an insulating layer on a blanket contact of the semiconductor as thin as possible. Embodiments provide a method for forming a contact capable of simultaneously realizing the normal contact of the ESD device and the blanket contact of the semiconductor through an etch process using a single mask.

According to embodiments, a method for manufacturing a semiconductor includes forming an active region for an ESD device, an active region for a first polygate and the semiconductor, and a second polygate having a form of a blanket trench on and/or over a substrate, forming an interlayer dielectric layer including first and second insulating on and/or over the substrate, planarizing the interlayer dielectric layer, forming a contact pattern to open a portion of the interlayer dielectric layer over the first polygate, forming a first polygate trench by performing a first etch process with respect to the second insulating layer below the contact pattern, and performing a second etch process to remove the first insulating layer inside the first polygate trench, and to remove the first insulating layer over the active region of the semiconductor other than the second polygate.

DRAWINGS

FIGS. 1 to 5 are sectional views showing a method for manufacturing a semiconductor according to embodiments.

DESCRIPTION

Hereinafter, a method for manufacturing a semiconductor according to embodiments will be described with reference to accompanying drawings. In the description of embodiments, it will be understood that when a layer (or film) is referred to as being 'on' another layer or substrate, it can be directly on another layer or substrate, or intervening layers may also be present. Further, it will be understood that when a layer is referred to as being 'under' another layer, it can be directly under another layer, and one or more intervening layers may also be present. In addition, it will also be understood that when a layer is referred to as being 'between' two layers, it can be the only layer between the two layers, or one or more intervening layers may also be present.

FIGS. 1 to 5 are sectional views showing the method for manufacturing the semiconductor according to embodiments. FIG. 1 is a side sectional view showing an electro-static discharge (ESD) device and a semiconductor after a pre-metal dielectric (PMD) layer 140 has been deposited in order to form contacts of the ESD device and the semiconductor. Referring to FIG. 1, the ESD device and the semiconductor according to embodiments are shown before the contacts of the ESD device and the semiconductor are formed. The ESD device is formed in the left region A of a dashed line, and the semiconductor such as a MOSFET is formed in the right region B of the dashed line.

A P-type well layer, an N-type well layer, an N+ region, and a P+ region, and a first polygate 110 may be formed in the left active region A of a substrate 105 such as a single crystalline silicon substrate. A first gate insulating layer 112 may be formed between the first polygate 110 and the substrate 105.

In the right active region B of the substrate 105, source, drain, and channel regions are formed, and a second polygate 120 may be formed. A second gate insulating layer 122 is formed between the second polygate 120 and the substrate 105. Since the second polygate 120 has the form of a blanket trench, step difference may result between the first and second polygates 110 and 120.

As described above, the PMD layer 140 may be formed on and/or over the substrate 105 in which the first polygate 110 of the ESD device and the second polygate 120 of the semiconductor are formed. The PMD layer 140 may include first and second insulating layers 142 and 141 (See FIG. 4). For example, the first insulating layer 142 may include a TEOS layer, and the second insulating layer 141 may include a BPSG layer, but embodiments are not limited thereto. The TEOS layer is stacked at a thickness of about 1400 Å to about 1600 Å, and the BPSG layer may have a thickness of about 4000 Å to abut 6000 Å over the TEOS layer. Since the TEOS layer and BPSG layer include materials similar to each other, the discrimination between the TEPS layer and the BPSG layer is difficult through a naked eye of a person. If necessary, the TEOS layer and the BPSG layer will be assigned with different reference numerals for the purpose of explanation.

In this case, since an ESD region A and a semiconductor region B have step difference, the regions A and B may have different topologies. Accordingly, the PMD layer 140 has different thicknesses in the ESD region A and the semiconductor region B. For example, although the PMD layer 140 has a thickness d1 of about 6000 Å to about 7000 Å on the first polygate 110, the PMD layer 140 has a thickness d2 of about 5000 Å to about 5500 Å on the substrate 105 including the second polygate 120. According to embodiments, since the PMD layer 140 may be formed several times, the step difference between the ESD region A and the semiconductor region B may be increased.

Thereafter, according to embodiments, a planarization process may be performed with respect to the substrate 105 having the PMD layer 140. For example, a CMP process may be performed with respect to the PMD layer 140. Thus, according to embodiments, after the planarization process has been performed, the thickness d3 of the PMD layer 140 in the ESD device may become more thinned than the thickness d4 of the PMD layer 140 in the semiconductor due to the step difference of the PMD layer 140. According to embodiments, after forming a PMD layer approximately twice as thick as a PMD according to a related device, the PMD layer may be densified in a furnace. Thereafter, a PMD CMP may be performed with respect to the resultant structure. As a result, the ESD region having a high step difference is sufficiently polished, and the MOSFET region having a low step difference is slightly polished.

Figure 3:
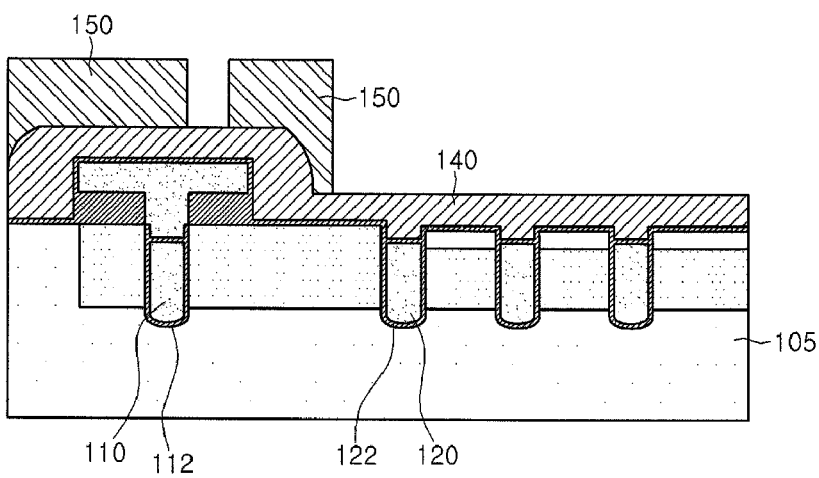

Next, after performing a contact pattern process, a contact etch process may be performed. Accordingly, since the thickness of the PMD layer is relatively high in the semiconductor region (e.g., MOSFET region), and relatively low in the ESD region, a contact hole of the ESD region is wholly opened and sufficiently over etched when the MOSFET region is contact-etched. In other words, as shown in FIG. 3, a contact pattern 150 may be formed on the PMD layer 140 corresponding to the first polygate 110 through a photolithography process. The contact pattern 150 can include photoresist, and opens a portion of the PMD layer 140 in order to form a trench to expose the first polygate 110.

Figure 4:
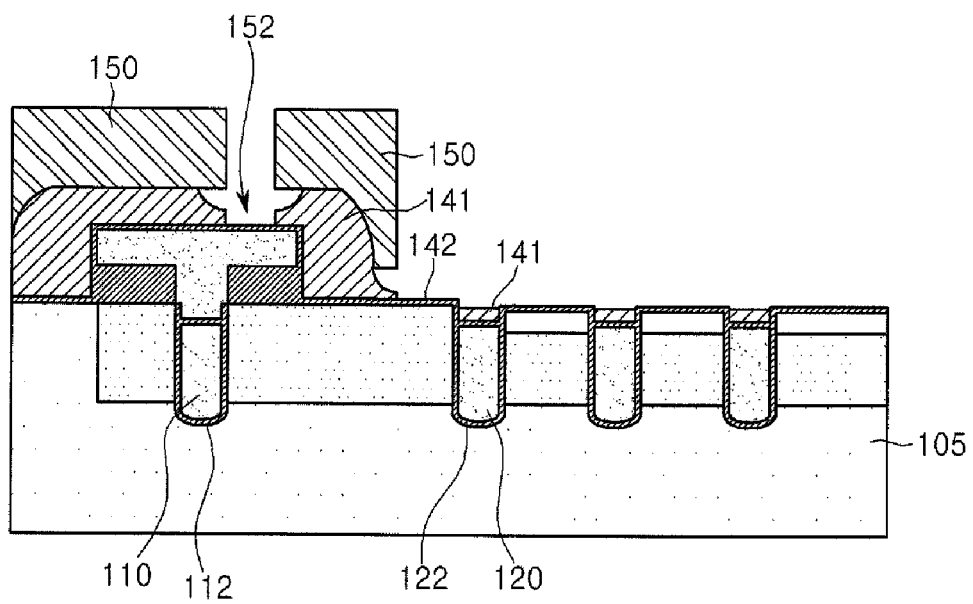

Thereafter, as shown in FIG. 4, an etch process may be performed to form the contacts of the ESD device and the semiconductor. The etch process may be performed, for example, by dry etch equipment employing a plasma etch scheme in which process variables can be easily adjusted. The process variables are adjusted to realize different isotropic etch features and profiles. As shown in FIG. 4, the PMD layer 140 over the first polygate 110 is etched in the form of a wine glass. When the MOSFET region is contact-etched in the form of the wine glass, a contact hole of the ESD region can be wholly opened and sufficiently over etched. Accordingly, the PMD layer 140 over the second polygate 120 is not completely removed, but remains. The contact etch process may be performed with respect to a BPSG layer which is the second insulating layer 141 of the PMD layer 140. Therefore, according to embodiments, the contacts of the ESD device and the semiconductor may be simultaneously formed while maintaining the loss of the BPSG layer 141 to about 1000 Å or less. Referring to FIG. 4, the BPSG layer 141 is not completely removed from the blanket trench over the second polygate 120, but remains.

Figure 5:
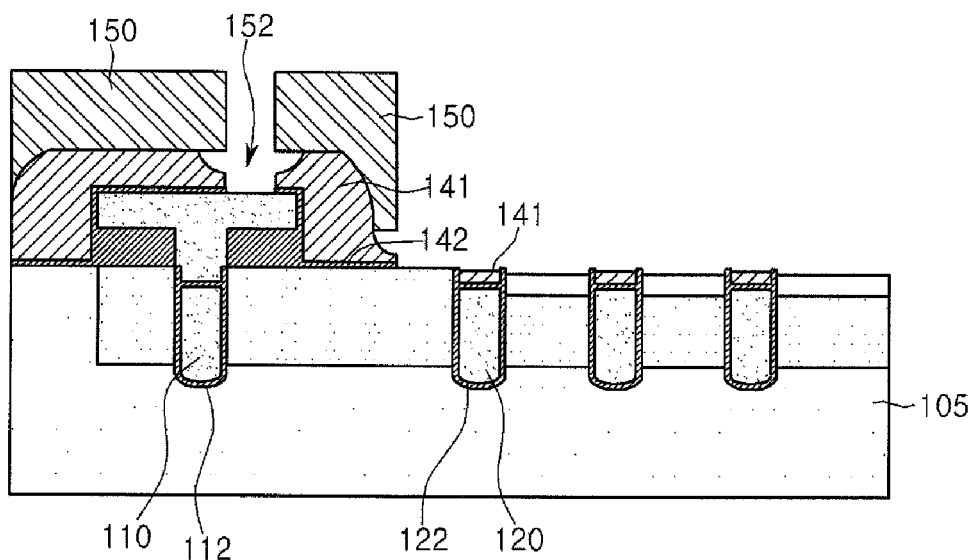

Next, as shown in FIG. 5, the first insulating layer 142 may be removed to expose the substrate 105. For example, the etch process can employ an end point detection (EPD) scheme. A main etch process may be performed until the surface of the substrate 105 is exposed, and then an over etch can be performed within a short time as possible. Accordingly, the TEOS layer 142 may be etched from a bottom surface of the trench 152 in the ESD region. In addition, the TEOS layer 142 (see FIG. 4) may be etched from the substrate 105 other than the blanket trench over the second polygate 120 and the contact pattern 150. Thereafter, a metallic layer may be formed on the front side of the substrate 105 including the trench over the first polygate 110 and the blanket trench over the second polygate 120, thereby performing a metal interconnection process.

According to embodiments, the normal contact of the ESD device and the blanket contact of the semiconductor are simultaneously formed by employing a single mask and an etch process. Accordingly, the manufacturing cost is minimized, so that the production can be maximized.

It will be obvious and apparent to those skilled in the art that various modifications and variations can be made in the embodiments disclosed. Thus, it is intended that the disclosed embodiments cover the obvious and apparent modifications and variations, provided that they are within the scope of the appended claims and their equivalents.

What is claimed is:

1. A method comprising:
   forming an active region for an electro-static discharge device, an active region for a first polygate and a semiconductor, and a second polygate having a form of a blanket trench over a substrate;
   forming an interlayer dielectric layer including first and second insulating layers over the substrate;
   planarizing the interlayer dielectric layer;
   forming a contact pattern to open a portion of the interlayer dielectric layer over the first polygate;
   forming a first polygate trench by performing a first etch process with respect to the second insulating layer below the contact pattern; and
   performing a second etch process to remove the first insulating layer inside the first polygate trench and to remove the first insulating layer over the active region of the semiconductor other than the second polygate.

2. The method of claim 1, wherein the interlayer dielectric layer is formed more than once so that step difference is formed between the electro-static discharge device and the semiconductor.

3. The method of claim 1, wherein the planarizing of the interlayer dielectric layer includes performing a chemical-mechanical polishing with respect to the interlayer dielectric layer such that the interlayer dielectric layer of the electro-static discharge device is thinner than the interlayer dielectric layer of the semiconductor.

4. The method of claim 1, wherein the first polygate trench is formed by etching a portion of a top surface of the second insulating layer below the contact pattern in a form of a wine glass.

5. The method of claim 1, wherein the performing the second etch process to remove the first insulating layer inside the first polygate trench, and remove the first insulating layer over the active region of the semiconductor other than the second polygate includes an end point detection scheme.

6. The method of claim 5, wherein the end point detection scheme includes a main etch process performed until a surface of the substrate is exposed and an over etch process.

7. The method of claim 1, wherein the first etch process includes an isotrophic etch process.

8. The method of claim 1, wherein the second etch process includes an anisotrophic etch process.

9. The method of claim 6, wherein the second etch process includes an isotrophic etch process.

10. A method comprising:
forming an active region for an electro-static discharge device, an active region for a first polygate and a semiconductor, and a second polygate having a form of a blanket trench over a substrate;
forming an interlayer dielectric layer including first and second insulating layers over the substrate;
forming a contact pattern to open a portion of the interlayer dielectric layer over the first polygate;
forming a first polygate trench by performing a first etch process with respect to the second insulating layer below the contact pattern; and
performing a second etch process to remove the first insulating layer inside the first polygate trench and to remove the first insulating layer over the active region of the semiconductor other than the second polygate.

11. The method of claim 10, wherein the interlayer dielectric layer is formed more than once so that step difference is formed between the electro-static discharge device and the semiconductor.

12. The method of claim 10, wherein the first polygate trench is formed by etching a portion of a top surface of the second insulating layer below the contact pattern in a form of a wine glass.

13. The method of claim 10, wherein the performing the second etch process to remove the first insulating layer inside the first polygate trench, and remove the first insulating layer over the active region of the semiconductor other than the second polygate includes an end point detection scheme.

14. The method of claim 13, wherein the end point detection scheme includes a main etch process performed until a surface of the substrate is exposed and an over etch process.

15. The method of claim 10, wherein the first etch process includes an isotrophic etch process.

16. The method of claim 10, wherein the second etch process includes an anisotrophic etch process.

17. The method of claim 14, wherein the second etch process includes an isotrophic etch process.

18. The method of claim 10, comprising:
planarizing the interlayer dielectric layer.

19. The method of claim 18, wherein the planarizing of the interlayer dielectric layer includes performing a chemical-mechanical polishing with respect to the interlayer dielectric layer such that the interlayer dielectric layer of the electro-static discharge device is thinner than the interlayer dielectric layer of the semiconductor.

20. The method of claim 10, wherein the first insulating layer includes tetraethyl orthosilicate and the second insulating layer includes borophosphosilicate glass.

\* \* \* \* \*